United States Patent
Hui et al.

(10) Patent No.: US 8,790,530 B2
(45) Date of Patent: Jul. 29, 2014

(54) PLANAR CELL ONO CUT USING IN-SITU POLYMER DEPOSITION AND ETCH

(75) Inventors: Angela T. Hui, Fremont, CA (US); Gang Xue, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 624 days.

(21) Appl. No.: 12/703,586

(22) Filed: Feb. 10, 2010

(65) Prior Publication Data

US 2011/0195578 A1   Aug. 11, 2011

(51) Int. Cl.
*G01L 21/30* (2006.01)
*H01L 21/302* (2006.01)

(52) U.S. Cl.
USPC .............. 216/59; 216/67; 438/142; 438/718; 438/720; 438/723; 438/724

(58) Field of Classification Search
USPC ........... 216/67; 365/185.01; 438/143, 718.72, 438/723, 724
See application file for complete search history.

(56) References Cited

U.S. PATENT DOCUMENTS

| 5,766,998 A * | 6/1998 | Tseng ............................ 438/291 |
| 5,956,587 A * | 9/1999 | Chen et al. .................... 438/255 |
| 7,067,377 B1 * | 6/2006 | Park et al. ..................... 438/270 |
| 2003/0178675 A1 * | 9/2003 | Nishizaka et al. ............. 257/340 |
| 2007/0042548 A1 * | 2/2007 | Noh et al. ..................... 438/257 |
| 2009/0236693 A1 * | 9/2009 | Moustakas et al. ........... 257/615 |
| 2011/0199819 A1 * | 8/2011 | Fang et al. ............... 365/185.01 |

* cited by examiner

*Primary Examiner* — Shamim Ahmed
(74) *Attorney, Agent, or Firm* — Sterne, Kessler, Goldstein & Fox P.L.L.C.

(57) ABSTRACT

A method and manufacture for charge storage layer separation is provided. A layer, such as a polymer layer, is deposited on top of an ONO layer so that the polymer layer is planarized, or approximately planarized. The ONO includes at least a first region and a second region, where the first region is higher than the second region. For example, the first region may be the portion of the ONO that is over the source/drain region, and the second region may be the portion of the ONO that is over the shallow trench. Etching is performed on the polymer layer to expose the first region of the ONO layer, leaving the second region of the ONO unexposed. The etching continues to occur to etch the exposed ONO at the first region so that the ONO layer is etched away in the first region and the second region remains unexposed.

15 Claims, 8 Drawing Sheets

PLANAR CELL ONO CUT USING IN-SITU POLYMER DEPOSITION AND ETCH

TECHNICAL FIELD

The invention is related to the fabrication of computer-readable memory, and in particular, but not exclusively, to a method and manufacture for a separating the charge storage ONO layer at the dense array structure of a flash memory NAND device during device fabrication.

BACKGROUND

Various types of electronic memory have been developed in recent years. Some exemplary memory types are electrically erasable programmable read only memory (EEPROM) and electrically programmable read only memory (EPROM). EEPROM is easily erasable but lacks density in storage capacity, where as EPROM is inexpensive and denser but is not easily erased. "Flash" EEPROM, or Flash memory, combines the advantages of these two memory types. This type of memory is used in many electronic products, from large electronics like cars, industrial control systems, and etc. to small portable electronics such as laptop computers, portable music players, cell phones, and etc.

Flash memory is generally constructed of many memory cells where a single bit is held within each memory cell. Yet a more recent technology known as MirrorBit™ Flash memory doubles the density of conventional Flash memory by storing two physically distinct bits on opposite sides of a memory cell. The reading or writing of a bit occurs independently of the bit on the opposite side of the cell. A memory cell is constructed of bit lines formed in a semiconductor substrate. A split oxide-nitride-oxide (ONO) dielectric layer formed over top of the substrate and bit lines. The nitride serves as the charge storage layer between two insulating layers. Word lines are then formed over top of the ONO layer perpendicular to the bit lines. Applying a voltage to the word line, acting as a control gate, along with an applied voltage to the bit line allows for the reading or writing of data from or to that location in the memory cell array. MirrorBit™ Flash memory may be applied to different types of flash memory, including NOR flash and NAND flash.

BRIEF DESCRIPTION OF THE DRAWINGS

Non-limiting and non-exhaustive embodiments of the present invention are described with reference to the following drawings, in which.

DETAILED DESCRIPTION

Figure 1:
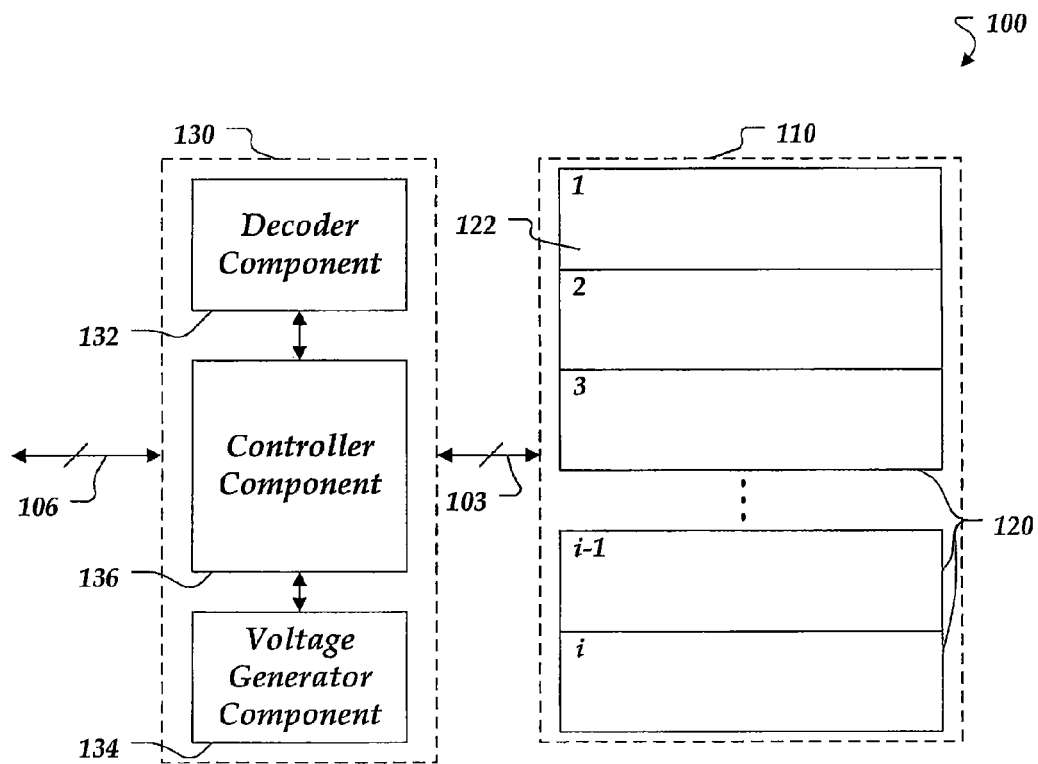
FIG. 1 illustrates a block diagram of an embodiment of a memory.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "signal" means at least one current, voltage, charge, temperature, data, or other signal.

Briefly stated, the invention is related to a method and manufacture for charge storage layer separation. A layer, such as a polymer layer, is deposited on top of an oxide-nitride-oxide (ONO) layer so that the polymer layer is planarized, or approximately planarized. The ONO includes at least a first region and a second region, where the first region is higher than the second region. For example, the first region may be the portion of the ONO that is over the source/drain region, and the second region may be the portion of the ONO that is over the shallow trench. Etching is performed on the polymer layer to expose the first region of the ONO layer, leaving the second region of the ONO unexposed. The etching continues to occur to etch the exposed ONO at the first region so that the ONO layer is etched away in the first region and the second region remains unexposed.

FIG. 1 shows a memory environment in which embodiments of the invention may be employed. Not all the components illustrated in the figures may be required to practice the invention, and variations in the arrangement and type of the components may be made without departing from the spirit or scope of the invention. For example, although described in the context of a flash-based memory, the fabrication described herein may be employed in manufacturing other types of microelectronic memories or devices other than memory in which separating layers of a charge storage layer, ONO layer, and/or the like, is performed.

As shown, memory 100 includes arrayed memory 110 and memory controller 130. Memory controller 130 is arranged to communicate addressing data and program data over signal path 106. For example, signal path 106 can provide 8, 16, or more I/O lines of data. Memory controller 130 is also configured to access arrayed memory 110 over signal path 103. For example, memory controller 130 can read, write, erase, and perform other operations at portions of arrayed memory 110 via signal path 103. In addition, although shown as single lines, signal path 103 and/or signal path 106 may be distributed across a plurality of signal lines and/or bus lines.

Arrayed memory 110 includes memory sectors 120 (identified individually as sectors 1-i) that can be accessed via memory controller 130. Memory sectors 120 can include, for example, 256, 512, 1024, 2048 or more sectors having memory cells that can be individually or collectively accessed. For example, in a NAND-based architecture, the individual memory cells are accessed collectively. In other examples, the number and/or arrangement of memory sectors can be different. In one embodiment, for example, sectors 120 can be referred to more generally as memory blocks and/or can be configured to have a configuration that is different than a bit line, word line, and/or sector topology.

Memory controller 130 includes decoder component 132, voltage generator component 134, and controller component 136. In one embodiment, memory controller 130 may be located on the same chip as arrayed memory 110. In another embodiment, memory controller 130 may be located on a different chip, or portions of memory controller 130 may be located on another chip or off chip. For example, decoder component 132, controller component 134, and voltage generator component 136 can be located on different chips but co-located on the same circuit board. In other examples, other implementations of memory controller 130 are possible. For example, memory controller 130 can include a programmable microcontroller.

Decoder component 132 is arranged to receive memory addresses via addressing signal path 106 and to select individual sectors, arrays, or cells according to the architecture of arrayed memory 110. In an NAND-based architecture, individual memory cells can be accessed collectively but not individually.

Decoder component 132 includes, for example, multiplexer circuits, amplifier circuits, combinational logic, or the like for selecting sectors, arrays, and/or cells based on any of a variety of addressing schemes. For example, a portion of a memory address (or a grouping of bits) can identify a sector within arrayed memory 110 and another portion (or another grouping of bits) can identify a core cell array within a particular sector.

Voltage generator component 134 is arranged to receive one or more supply voltages (not shown) and to provide a variety of reference voltages required for reading, writing, erasing, pre-programming, soft programming, and/or under-erase verifying operations. For example, voltage generator component 134 can include one or more cascode circuits, amplifier circuits, regulator circuits, and/or switch circuits that can be controlled by controller component 136.

Controller component 136 is arranged to coordinate reading, writing, erasing, and other operations of memory 100. In one embodiment, controller component 136 is arranged to receive and transmit data from an upstream system controller (not shown). Such a system controller can include, for example, a processor and a static random access memory (SRAM) that can be loaded with executable processor instructions for communicating over signal path 106. In another embodiment, controller component 136 as well as other portions of memory controller 130 may be embedded or otherwise incorporated into a system controller or a portion of a system controller.

Embodiments of controller component 136 can include a state machine and/or comparator circuits. State machine and comparator circuits can include any of a variety of circuits for invoking any of a myriad of algorithms for performing reading, writing, erasing, or other operations of memory 100. State machines and comparator circuits can also include, for example, comparators, amplifier circuits, sense amplifiers, combinational logic, or the like.

In one embodiment, memory 100 is a flash-based memory including flash-based memory cells, such as flash-based NAND cells, NOR cells, or hybrids of the two.

Figure 2:
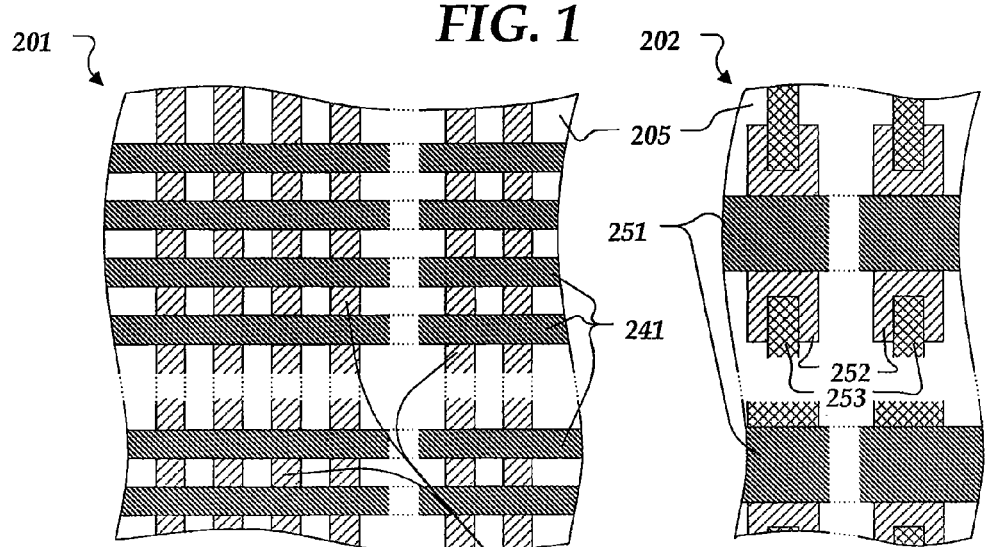
FIG. 2 shows a partial top plan view of an embodiment of core and peripheral sections of a memory that may be employed in the memory of FIG. 1.

FIG. 2 shows a partial top plan view of separate sections of a memory. Core section 201, for example, may be an embodiment of a portion of sector 120 of FIG. 1 and may include arrayed core memory cells. Peripheral section 202, for example, may be an embodiment of memory controller 110 of FIG. 1 or a portion of memory controller 110 of FIG. 1.

Core section 201 includes core polysilicon lines 241, conductive regions 242, and a portion of substrate 205. Portions of core polysilicon lines 241 are coupled to the gates of individual memory cells (not shown in FIG. 2) and can be configured as a word line, a source select gate line, and/or a drain select gate line. Portions of conductive regions 242 can include, for example, p-type and/or n-type doped regions of substrate 205 for forming source/drain regions and/or conductive lines. For example, conductive regions 242 can form portions of bit lines and/or other signal lines. Also, in some embodiments, individual conductive regions 242 extend at least partially underneath individual core polysilicon lines 241.

In one embodiment, core section 201 is arranged in a NOR topology, and individual memory cells can be individually accessed via individual conductive regions 242. In another embodiment, core section 201 is arranged in a NAND topology, and individual memory cells can be accessed though individual conductive regions 242 collectively but not individually. In other embodiments, hybrid architectures can be employed. For example, core section 201 can be configured to have a portion that is NAND-based and another portion that is NOR-based. Also, although not shown if FIG. 2, core section 201 may include any of a variety of interconnect and/or passivation layers, such as dielectric, conductive, or other layers. For example, conductive regions 242 can be positioned beneath a dielectric spacer layer.

Peripheral section 202 includes peripheral polysilicon lines 251, conductive regions 252, and interconnects 253. Portions of peripheral polysilicon lines 251 are coupled to individual peripheral devices (not shown in FIG. 2).

Portions of conductive regions 252 can include, for example, p-type and/or n-type doped regions of substrate 205 for forming conductive features, such as a source, a drain, or other type of well. Interconnects 253 can include conductive lines that electrically intercouple portions of peripheral section 202 and/or electrically couple core section 201 with peripheral section 202. For example, interconnects 253 can include a combination of metal lines and vias. Also, although not shown FIG. 2, peripheral section 202 may also include any of a variety of other interconnect and/or passivation layers.

Figure 3:
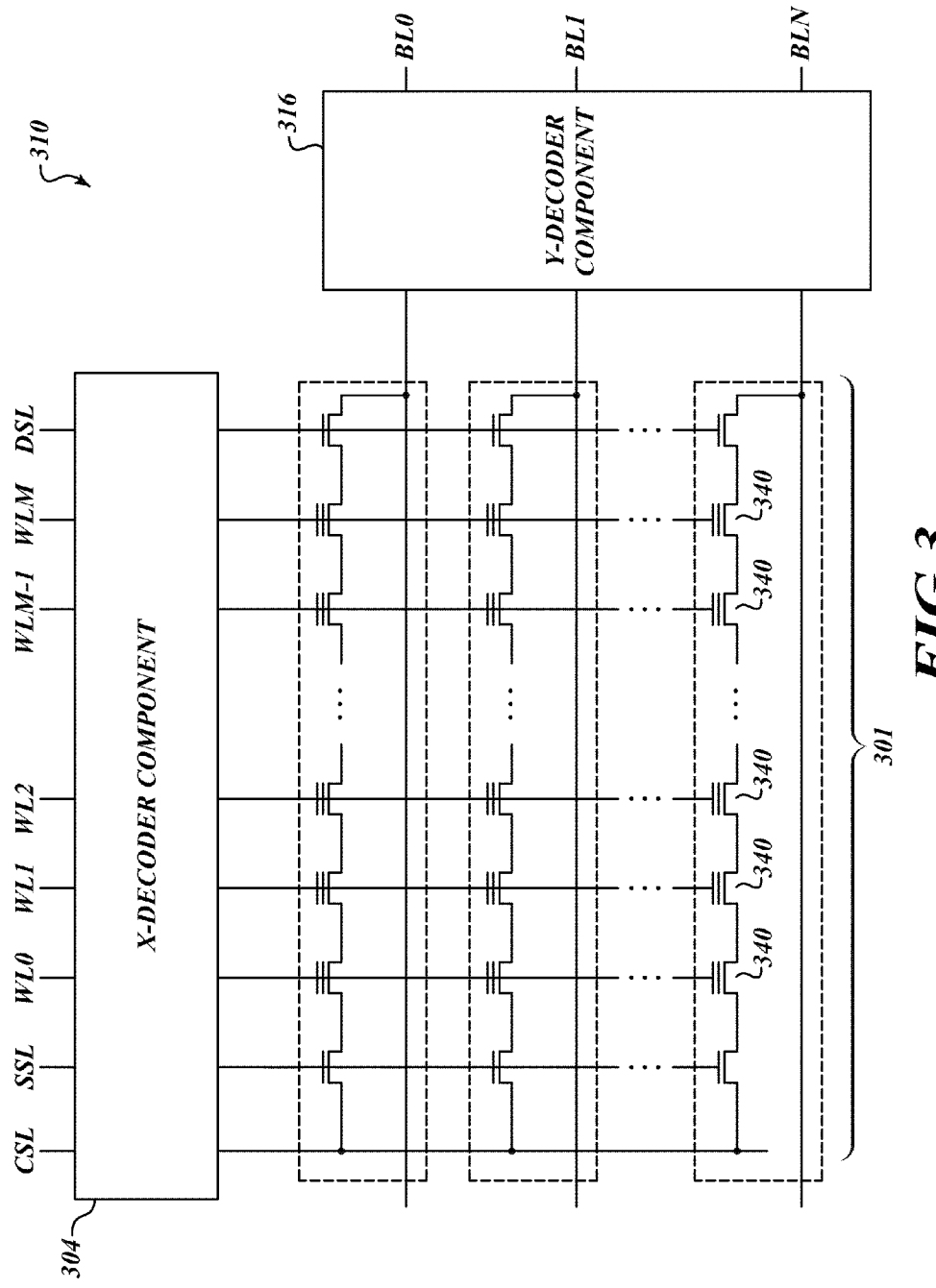
FIG. 3 illustrates a block diagram of an embodiment of a NAND memory array.

FIG. 3 illustrates a block diagram of an embodiment of a NAND memory array (310) that may be employed as an embodiment of memory array 110 of FIG. 1. Memory array 310 includes memory cells 340. Each memory cell 340 stores one or more bits of data. Memory array 310 can be associated with an X-decoder component 304 (e.g., word line (WL) decoder) and a Y-decoder component 316 (e.g., bit line (BL) decoder) that can each respectively decode inputs/outputs during various operations (e.g., programming, reading, verifying, erasing) that can be performed on the memory cells 340. The X-decoder component 304 and Y-decoder component 316 can each receive address bus information from memory controller 130 of FIG. 1, and can utilize such information to facilitate accessing or selecting the desired memory cell(s) (e.g., memory location(s)) associated with the command. The memory cells 340 can be formed in M rows and N columns. A common WL can be attached to the gate of each memory cell 340 in a row, such as word-lines WL0, WL1, WL2, through WLM. A common BL is attached collectively to cells 340, such as bit-lines BL0, BL1, through BLN as depicted in the respective diagrams. Respective voltages can be applied to one or more cells 340 through the WLs and BLs to facilitate performing operations, such as program, read, erase, and the like.

Figure 4:
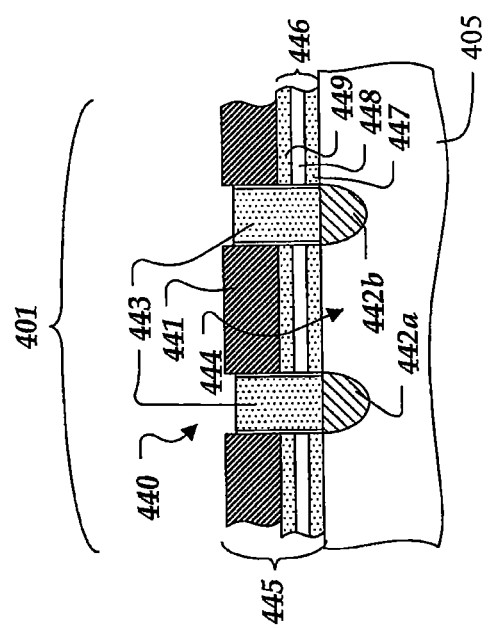
FIG. 4 shows a cross-sectional side view of an embodiment of a core section of FIG. 2.

FIG. 4 shows a cross-sectional side view of a memory cell in core section 401. In one embodiment, core section 401 is an embodiment of core section 201 of FIG. 2.

Memory cell 440 includes a portion of substrate 405, dielectric spacer layer 443, channel region 444, source/drain regions 442a and 442b, and layered stack 445, including charge trapping component 446 and a portion of core polysilicon line 441. Substrate 405 may be an embodiment of substrate 205 of FIG. 2. Source/drain regions 442a and 442b may be an embodiment of one or more conductive regions 242 of FIG. 2. Core polysilicon line 441 may be an embodiment of an individual core polysilicon line 241 of FIG. 2.

In operation, core polysilicon line 441 and source/drain regions 442a and 442b are configured to provide electrical potential(s) to memory cell 440 for trapping charge at charge trapping component 446. A bit is "programmed" when it is trapping a charge and "unprogrammed" when it is not trapping charge. To trap charge, charge trapping component 446 employs tunneling layer 447, charge trapping layer 448, and dielectric layer 449. In general, tunneling layer 447 provides a tunneling barrier, charge trapping layer 448 is a layer that is configured to store charge, and dielectric layer 449 electrically isolates charge trapping layer 448 from core polysilicon line 441. In one embodiment, memory cell 440 is a one bit memory cell that is configured to store up to two logic states. In another embodiment, memory cell 440 can store more than two logic (or bit) states.

In some embodiments, charge trapping component 446 is an oxide-nitride-oxide (ONO) layer in which dielectric layer 449 is an oxide (such as silicon dioxide), charge trapping layer 448 is a nitride, and tunneling layer 447 is an oxide (such as silicon dioxide). In one embodiment in which charge trapping layer 448 is a nitride, charge trapping layer 448 may be a silicon-rich nitride (SIRN) such as silicon nitride.

Figure 5:
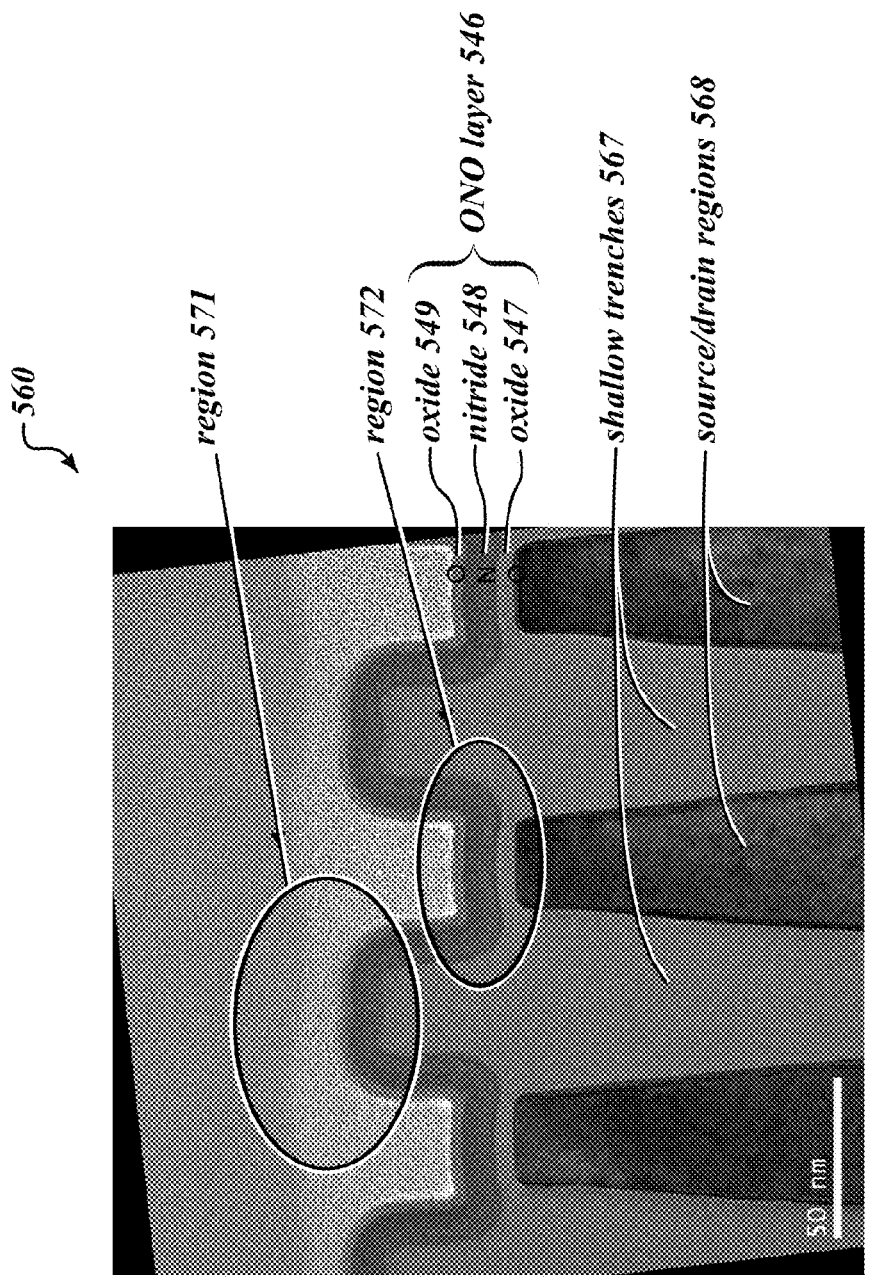
FIG. 5 illustrates a cross-sectional view of an embodiment of a portion of a NAND flash memory in fabrication prior to performing charge storage layer separation.

FIG. 5 illustrates a cross-sectional view of an embodiment of a portion (560) of a NAND flash memory in fabrication prior to performing charge storage layer separation. The cross-sectional view illustrated in FIG. 5 is orthogonal to the view illustrated in FIG. 4. Portion 560 includes ONO layer 546, shallow trenches 567, and source/drain regions 568. ONO layer 546 includes oxide layer 549, nitride layer 548, and oxide layer 547.

As previously discussed, ONO layer 546 traps or stores charge for the flash memory. Oxide layer 547 provides a tunneling barrier, nitride layer 548 is a layer that is configured to store charge, and oxide layer 549 electrically isolates nitride layer 548 from the core polysilicon line. In some embodiments, the oxide for both oxide layer 547 and oxide layer 549 is silicon dioxide, and nitride layer 548 is SIRN.

Portion 560 uses shallow trench isolation to prevent electrical current leakage between adjacent memory cells in the flash memory. Each shallow trench 567 may include an insulator such as silicon dioxide. Source/drain region includes source/drain regions such as source drains 442a and 442b of FIG. 4. The actual cross-section shown would actually include a cross-section of the channel region 444 of FIG. 4 of the substrate between the source-drain regions, where once source/drain region would be above the page, and one source/region would be below the page, with the channel being between the two source/drain regions, but this region is conventionally referred to as the source/drain region in such a cross-section drawing even though it is literally cross-section of the channel region that is in the specific cross-section shown.

The ONO layer includes regions, including a first region 571 that is above one of the shallow trenches 567, and a second region 572 that is above one of the source/drain regions 568. As shown, the first region 571 is higher than height than the second region 572, since the ONO layer in region 571 is above a shallow trench 567, and the ONO layer in region 572 is above the source/drain region 568, which is lower in height than the shallow trench 567.

Modern semiconductor devices are typically created as integrated circuits manufactured on the surface of a substrate of semiconductor material. The processing begins by growing a wafer, which is typically done using the Czochralski process. Various devices are formed on the wafer using a series of steps that include deposition, removal processes (such as etching), patterning, and doping. Few steps or many hundreds of such steps may be used in various designs. The patterning steps may be performed by photolithography or other lithographic methods. For example, the wafer may be coated with a photoresist, which is exposed with a device that exposes light through photomasking, exposing portions of the wafer not blocked by the photomask to light. The exposed regions are removed so that the photoresist remains only in areas that were not exposed to light. This allows a layer to be etched according to the pattern on the photomask. After the devices have been formed on the wafer, various back-end processing and packaging is performed, including properly interconnecting the devices and bringing metal lines to the chip edge for attachment to wires.

A designer creates the device design in accordance with a set of design rules provided by the fabricator, and creates a series of design files based on the design. Various design tools may be used by the designer in creating the design, simulating the design, and checking the design for layout rules violations. When completed, the design files are provided to the fabricator, which are used to generate photomasks for use in the fabricating the device. The design files may be communicated in different ways, including over a network.

Figure 6:
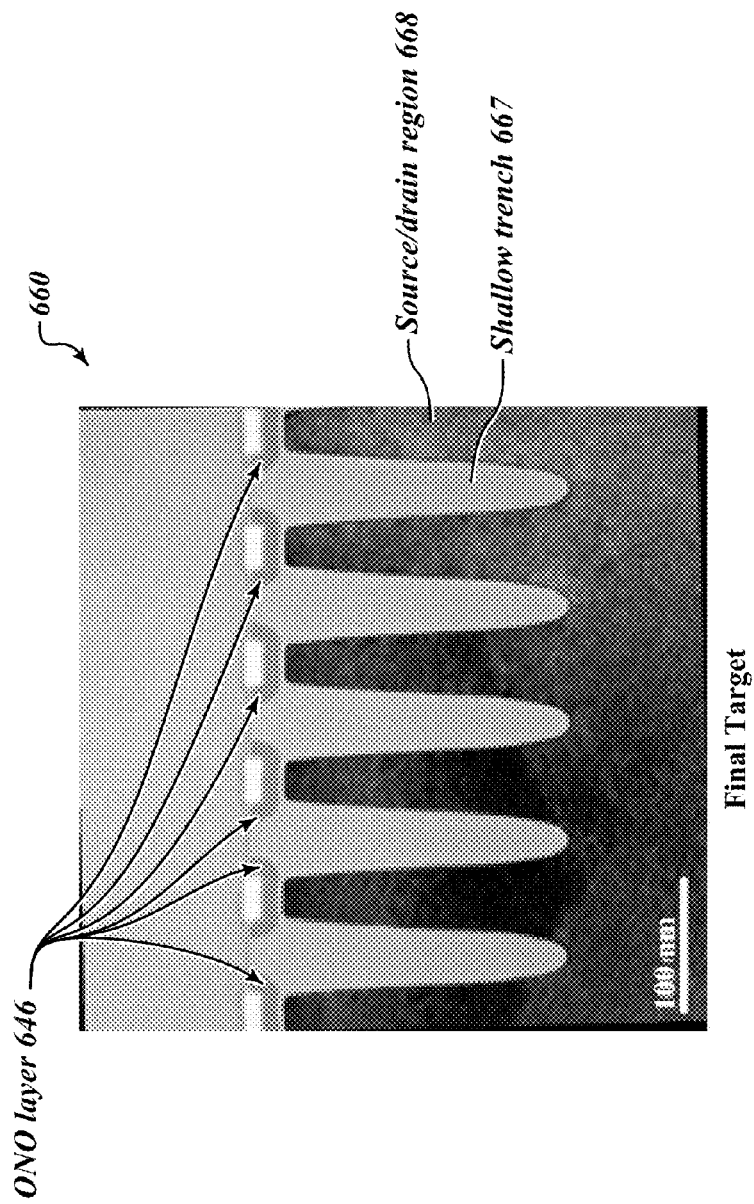
FIG. 6 shows a cross-sectional view of an embodiment of the portion of the NAND flash memory in fabrication of FIG. 4 after performing charge storage layer separation.

FIG. 6 shows a cross-sectional view of embodiment of a portion (660) of the NAND flash memory in fabrication, which is the portion 560 of FIG. 5 after performing charge layer separation. As shown, the ONO layer 646 of each core memory cell is separated from the ONO layer 646 in each other memory cell. The charge layer separation is performed in order to define the separate memory cells in the core section of the memory. If charge layer separation is not performed, one cell would short the cell adjacent to it. Further, the charge layer, which may be SIRN in one embodiment, may cause leakage if the charge layer is not separated relatively promptly.

Figure 7:
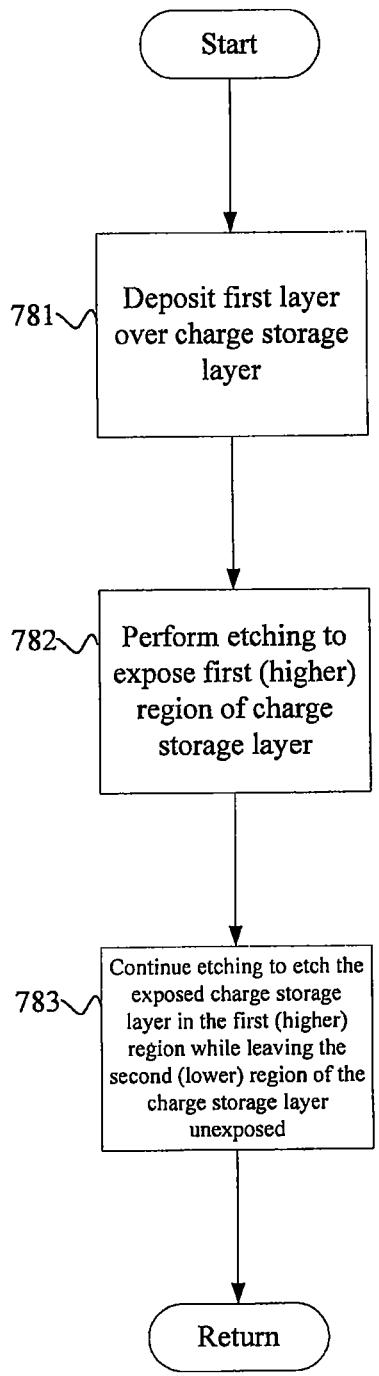
FIG. 7 illustrates a flow chart of an embodiment of a process of charge storage layer separation.

FIG. 7 illustrates a flow chart of an embodiment of a process (780) of charge storage layer separation.

After a start block, the process proceeds to block 781, where a first layer, such as a polymer layer in one embodiment, is deposited on top of a charge storage layer, such that the first layer is planarized or approximately planarized. The charge storage layer includes at least a first region and a second region. The first region is higher in height than the second region. The first layer is preferably a layer that can subsequently be easily removed without affecting the charge storage layer.

The process the moves to block 782, where etching is performed to expose the first region of the charge storage layer, while leaving the second region of the charge storage layer unexposed. The process then advances to block 783, where the etching of step 782 continues so that the exposed region of the charge storage layer is etched away, while leaving the second region of the charge storage layer unexposed. The process then proceeds to a return block, where other processing is resumed.

Figure 8:
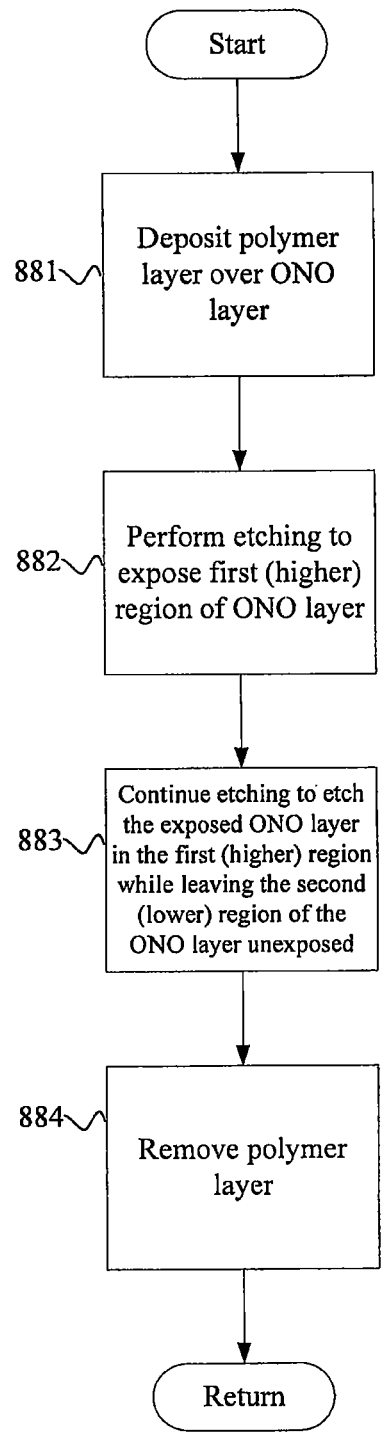
FIG. 8 shows a flow chart of an embodiment of the process of FIG. 7.
Figure 9:
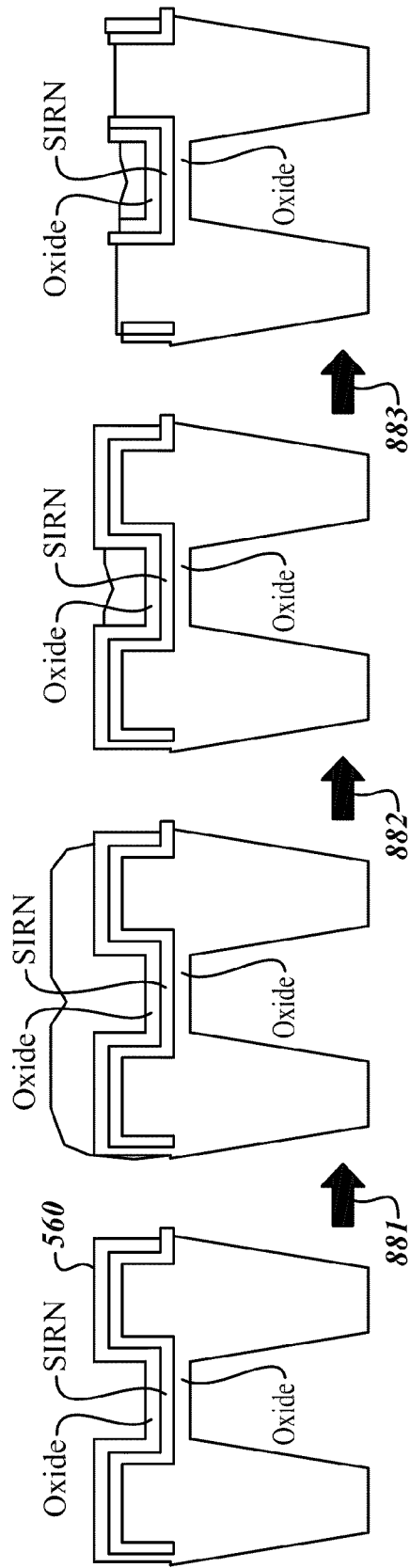
FIG. 9 illustrates a cross-sectional view of an embodiment of a portion of the NAND flash memory in fabrication of FIG. 5 undergoing an embodiment of the process of FIG. 8, in accordance with aspects of the invention.

FIG. 8 shows a flow chart of an embodiment of a process (880), which is an embodiment of process 780 of FIG. 7 on an embodiment of portion 560 of FIG. 5. These steps are also shown in FIG. 9 to illustrate the effects of the steps on portion 560.

After a start block, the process proceeds to block 881, where a polymer is uniformly deposited over the ONO layer 546. The deposition step is accomplished such that polymer has a planarized or approximately planarized top surface after the uniform polymer deposition is performed. That is, the top of the polymer layer has a uniform height after the polymer deposition is performed. The polymer is thicker over the regions of the ONO layer that are above the source/drain regions since the portions of the ONO layer that are over the source-drain regions are lower in height, and the top of the polymer layer has uniform height. This step gap-seals the narrow gap, because the polymer is deposited on top of the surface and also on the sidewall on both sides. To properly fill gap fill the polymer, in some embodiments roughly 20-40 nm of polymer deposition is employed.

In some embodiments, step 881 is performed with a plasma etcher. Chemistry such as $CH_4$, $CH_3F$, and/or $CH_2F_2$ may be employed. The etching process is modified so that polymer deposition occurs rather than etching. The condition of causing polymer deposition to occur during plasma etching to reduce the etch rate is known as polymerization. However, the parameters may be changed such that enough polymer deposition occurs that the process causes a polymer layer to accumulate on the wafer with no etching. Factors such as increased pressure, increased gas flow, and decreased temperature tend to cause an increase in polymer deposition. The exact parameters to use vary greatly based on the specific equipment being employed. In some embodiments, the deposited polymer layer may be a fluorocarbon polymer, or the like.

The process then moves to block 882, where the polymer and is etched back uniformly to expose the higher portions of the ONO layer (the portions of the ONO layer above the shallow trenches). The process then advances to block 883, where the etching of block 882 continues to etch away the ONO in the first region, so that the portions of the ONO layer above the shallow trenches are etched away. However, the portion of the ONO layer above the source-drain region is not etched at all. The etching preferably performed in a very controllable manner and with a uniform rate, with a 1:1:1 etching rate between the oxide, the nitride, and the polymer. The rate of the etching of the polymer should not be substantially greater that the rate of etching of the ONO layer; otherwise, the polymer in the gap will not protection the portion of the ONO layer above the source/drain region. The ONO that is above the source/drain region is protected by the polymer in the gap above the ONO in the source/drain region.

In some embodiments, the etching performed in blocks 882 and 883 is performed with plasma etching. In some embodiments, this plasma etching is performed using a carbon tetrafluoride ($CF_4$) chemistry. However, the invention is not so limited, and other suitable forms of etching may be employed.

The process then proceeds to block 884, where the remaining polymer is removed. The process then moves to a return block, where other processing is resumed.

In some embodiments, the process may be performed by reading from a machine-readable storage medium including a design file that is arranged to control the performance of an embodiment of process 880.

An embodiment of process 880 may efficiently and properly separates the charge storage ONO layer at the dense array structure in a cost-saving manner, while avoiding an incomplete ONO cut that could cause charge loss problems.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A method, comprising:
controlling a parameter of an etching process to deposit a first layer on an oxide-nitride-oxide (ONO) layer, the first layer being at least approximately planarized, wherein the ONO layer includes at least a first region and a second region, and wherein the e first region of the ONO layer is taller than the second region of the ONO layer; and
changing the parameter of the etching process to etch the first layer and the first region of the ONO layer.

2. The method of claim 1, wherein the first layer and the ONO layer are etched at substantially the same rate.

3. The method of claim 1, wherein the first layer is a polymer layer.

4. The method of claim 3, wherein the etching process is a plasma etching process.

5. The method of claim 1, wherein the etching process uses carbon tetrafluoride chemistry.

6. A method, comprising:
controlling a parameter of an etching process to deposit a first layer on an oxide-nitrlde-oxide (ONO) layer, the first layer being at least approximately planarized, wherein the ONO layer includes at least a first region and a second region, and wherein the first region of the ONO layer is taller than the second region of the ONO layer; and
changing the parameter of the etching process to etch the first layer and the first region of the ONO layer,
wherein the second region of the ONO layer is directly above a source/drain region.

7. The method of claim 6, wherein:
the ONO layer and the source/drain region form a portion of a flash memory device, and
a nitride portion of the ONO layers is configured to serve as a charge storage layer.

8. The method of claim 6, wherein:
the first region of the ONO layer is above a shallow trench that includes an oxide, and the shallow trench provides shallow trench isolation between separate memory cells of a flash memory device.

9. A computer-readable storage medium having instructions stored thereon, execution of which by a processor cause the processor to perform operations, the operations comprising:

controlling a parameter of an etching process to deposit a first layer on an oxide-nitride-oxide (ONO) layer, the first layer being least approximately planarized, wherein the ONO layer includes at least a first region and a second region, and wherein the first region of the ONO layer is taller than the second region of the ONO layer; and changing the parameter of the etching process to etch the first layer and the first region of the ONO layer.

10. The method of claim 1, wherein the controlling comprises:

controlling the parameter of the etching process according to an electronic design file.

11. The method of claim 1, wherein the etching process uses a $CH_3F$ chemistry.

12. The method of claim 1, wherein the etching process uses a $CH_2F_2$ chemistry.

13. The method of claim 1, wherein the parameter of the etching process comprises a pressure associated with the etching process.

14. The method of claim 1, wherein the parameter of the etching process comprises a gas flow associated with the etching process.

15. The method of claim 1, wherein the parameter of the etching process comprises a temperature associated with the etching process.

* * * * *